| United States Patent [19] | [11] Patent Number: 4,957,781 |
| Kanegae et al. | [45] Date of Patent: Sep. 18, 1990 |

[54] PROCESSING APPARATUS

[75] Inventors: Masatomo Kanegae; Takayoshi Kogano; Fumio Ito, all of Tokyo, Japan

[73] Assignees: Hitachi, Ltd.; Hitachi VLSI Engineering Corp.; Hitachi Tokyo Electronics Co., all of Tokyo, Japan

[21] Appl. No.: 201,442

[22] Filed: Jun. 2, 1988

Related U.S. Application Data

[63] Continuation of Ser. No. 6/888,071, Jul. 22, 1986, abandoned.

[30] Foreign Application Priority Data

Jul. 22, 1985 [JP] Japan ............................. 60-160236

[51] Int. Cl.$^5$ ............................................. C23C 16/00
[52] U.S. Cl. ............................ 427/255.3; 427/248.1; 427/255; 118/715; 118/728; 118/725; 414/217; 219/385; 219/390
[58] Field of Search ........................ 118/715, 725, 728; 414/217; 427/248.1, 255, 255.3; 219/390, 385

[56] References Cited

U.S. PATENT DOCUMENTS

| 3,828,722 | 8/1974 | Reuter | 118/725 |
| 4,436,509 | 3/1984 | Kocmanek | 118/729 |
| 4,640,223 | 2/1987 | Dozier | 118/725 |
| 4,695,706 | 9/1987 | Mizushina | 118/725 |

*Primary Examiner*—Richard Bueker
*Attorney, Agent, or Firm*—Antonelli, Terry, Stout & Kraus

[57] ABSTRACT

A processing apparatus includes a processing chamber and an insertion jig for inserting an object to be processed into the processing chamber. The processing chamber and the insertion jig are adapted to be individually movable relative to a heating section, so that the operation of loading and unloading the object into and from the processing chamber effected by the insertion jig is conducted outside the heating section, thereby preventing the outside air from being induced to enter the heated processing chamber, together with the object of the processing, and thus avoiding the occurrence of various problems, for example, the object of processing being disorderly oxidized by the oxygen contained in the outside air, and the foreign matter contained in the outside air being undesirably attached to the surface of the object, so as to obtain excellent processing results. Further, the insertion jig, which is adapted to insert an object to be processed into the processing chamber through an opening provided therein, is provided with an auxiliary tube which is movable relative to the insertion jig in the direction of movement of the jig and which is detachably connected to the opening of the processing chamber, thereby preventing the pg,2 outside air from being induced to enter the heated processing chamber, together with the object of processing, and thus avoiding various problems, e.g., the object of processing being undesirably oxidized by the oxygen contained in the outside air, and the foreign matter contained in the outside air being attached to the surface of the object of processing. In consequence, it is possible to obtain excellent processing results.

64 Claims, 3 Drawing Sheets

PROCESSING APPARATUS

This is a continuation of application Ser. No. 888,071, filed July 22, 1986 now abandoned.

BACKGROUND OF THE INVENTION

The present invention relates to a processing technique and, more particularly, to a technique effectively applied to thermal processing in manufacture of semiconductor devices.

In manufacture of semiconductor devices, it is general practice to employ a thermal oxide film forming apparatus wherein a substrate of a semiconductor such as silicon, i.e., a wafer, is oxidized under heating in an oxidizing atmosphere in order to form an oxide film on the wafer.

One type of conventional thermal oxide film forming apparatus has heretofore been arranged such that a reaction tube is horizontally disposed, and a wafer is inserted into the reaction tube from one end thereof and placed in position and then heated at a predetermined temperature by means of a heater provided around the reaction tube, and while doing so, a reaction gas containing a predetermined amount of oxygen is supplied into the reaction tube and held therein for a predetermined period of time, thereby forming an oxide film of a predetermined thickness on the surface of the wafer.

However, the present inventors have found that the apparatus of the type described above suffers from the following disadvantage. Namely, when a wafer is inserted into the reaction tube from one end thereof, the outside air is undesirably induced to enter, together with the wafer, the inside of the reaction tube due to, for example, the difference between the temperature of the outside air and that of the interior of the reaction tube which has already been heated to a predetermined temperature. In consequence, the surface of the wafer is disorderly oxidized by the oxygen contained in the outside air which has undesirably entered the reaction tube, thus causing the quality of the oxide film formed on the wafer to be deteriorated, disadvantageously.

Examples of literature describing the technique for forming an oxide film on a wafer include "Denshi Zairyo (Electronic Material)" (an extra number of 1984), Kogyo Chosakai Publishing Co., Ltd., Nov. 15, 1983, pp. 39 to 44.

SUMMARY OF THE INVENTION

It is a primary object of the present invention to provide a novel processing technique which enables prevention of the outside air from being induced to enter the reaction tube and thereby allows excellent processing results to be obtained.

The above and other objects, novel features and advantages of the present invention will be clear from the following description of the preferred embodiments thereof, taken in conjunction with the accompanying drawings.

The following is a brief summary of a representative of the novel techniques disclosed in this application.

Namely, a processing chamber and an insertion jig for inserting an object to be processed into the processing chamber are arranged such as to be individually movable relative to a heating section, so that the operation of loading and unloading the object of processing into and from the processing chamber effected by the insertion jig is conducted outside the heating section, thereby preventing the outside air from being induced to enter the heated processing chamber, together with the object of the processing, and thus avoiding the occurrence of various problems, for example, the object of processing being disorderly oxidized by the oxygen contained in the outside air, and the foreign matter contained in the outside air being undesirably attached to the surface of the object. In consequence, excellent processing results are obtained.

Further, the insertion jig, which is adapted to insert an object to be processed into the processing chamber through an opening provided therein, is provided with an auxiliary tube which is movable relative to the insertion jig in the direction of movement of the jig and which is detachably (removably) connected to the opening of the processing chamber, thereby preventing the outside air from being induced to enter the heated processing chamber, together with the object of processing, and thus avoiding various problems, e.g., the object of processing being undesirably oxidized by the oxygen contained in the outside air, and the foreign matter contained in the outside air being attached to the surface of the object of processing. In consequence, it is possible to obtain excellent processing results.

BRIEF DESCRIPTION OF THE DRAWINGS

The aforementioned and other objects and novel features of the present invention will become apparent from the following description taken with reference to the accompanying drawings, in which.

DESCRIPTION OF THE PREFERRED EMBODIMENTS [Embodiment 1]

Figure 1:
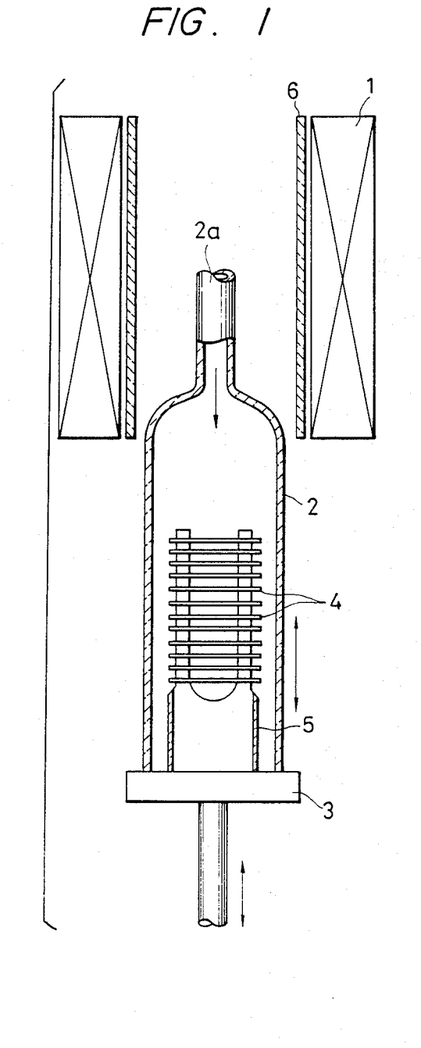
FIGS. 1 and 2 are schematic sectional views of a thermal oxide film forming apparatus in accordance with one embodiment of the present invention, which show the operation of the apparatus sequentially.
Figure 2:
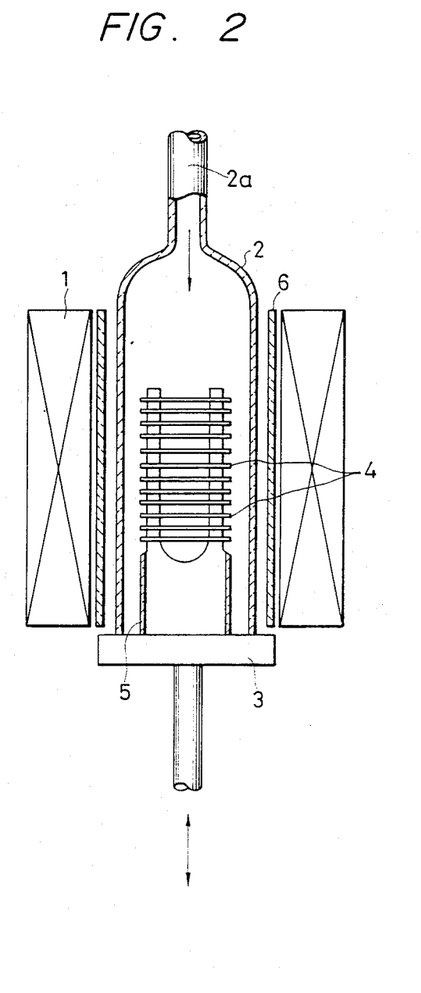

FIGS. 1 and 2 are schematic sectional views of a thermal oxide film forming apparatus in accordance with one embodiment of the present invention, which show the operation of the apparatus sequentially.

Referring to FIG. 1, a heater 1 (heating section) is provided in such a manner that the axis thereof extends vertically. A reaction tube 2 (processing chamber) is vertically movably provided inside the heater 1, the reaction tube 2 being adapted such that it is moved in the axial direction of the heater 1 so as to be selectively inserted into the area inside the heater 1 and drawn out of it.

The reaction tube 2 is made of, e.g., quartz and adapted to be subjected to radiation heat from the heater 1 so that the interior of the tube 1 is heated to a predetermined temperature.

A reaction gas supply pipe 2a is connected to the upper end of the reaction tube 2 in such a manner that a reaction gas (processing fluid) mixed with, for example, oxygen gas at a predetermined ratio is supplied to the inside of the reaction tube 2. The lower end of the reaction tube 2 is open. In another practical form for carrying out the present invention, an exhaust pipe for discharging the processing fluid is connected to the lower end of the reaction tube 2 for the purpose of increasing the exhaust efficiency. In still another practical form, an exhaust pipe is connected to the lower end of the reaction tube 2, while the lower end of the reaction tube 2 is closed, and a vacuum pump is connected to the exhaust pipe, thereby allowing the apparatus to be used as a vacuum thermal processing apparatus in which thermal processing is carried out inside tube reaction tube 2 which is kept at a vacuum.

A wafer support 3 (insertion jig) is disposed below the reaction tube 2 in such a manner that the wafer support 3 is movable in the direction in which the reaction tube 2 moved up and down. The wafer support 3 is adapted such that a cassette 5 which retains a plurality of wafers 4 (objects to be processed) is detachably mounted on the wafer support 3.

Thus, the reaction tube 2 is lowered from the upper side toward the wafer support 3 which is positioned below the heater 1 and on which the cassette 5 retaining a plurality of wafers 4 is mounted, and wafers 4 which are mounted on the wafer support 3 are inserted into the reaction tube 2 from the opening at the lower end thereof. After the open end of the reaction tube 2 has been brought into close contact with the surface of the wafer support 3, the reaction tube 2 is raised together with the wafer support 3 to reach the position shown in FIG. 2. In consequence, the reaction tube 2 and the plurality of wafers 4 mounted on the wafer support 3 are positioned inside the heater 1 and thereby heated to a predetermined temperature.

In addition, a soaking tube 6 is provide on the inner peripheral portion of the heater 1 in such a manner as to be disposed between the heater 1 and the reaction tube 2 when positioned inside the heater 1, whereby the heat radiated from the heater 1 is uniformly transmitted to the interior of the reaction tube 2.

The operation of this embodiment will be explained below.

First, the heater 1 is allowed to heat up to a predetermined temperature, and the atmosphere inside the reaction tube 2 is replaced by an inert gas such as nitrogen through the reaction gas supply pipe 2a.

Then, the cassette 5 which has a predetermined number of wafers 4 retained thereon is mounted on the wafer support 3 positioned below the heater 1.

Thereafter, the reaction tube 2 is lowered toward the wafer support 3. In consequence, the wafers 4 mounted on the wafer support 3 are moved, outside the heater 1, relative to the reaction tube 2 and thereby inserted to a predetermined position inside the reaction tube 2, and the downward movement of the reaction tube 2 is stopped when the open end of the tube 2 is brought into close contact with the surface of the wafer support 3.

Thus, the operation of inserting the wafers 4 into the reaction tube 2 is conducted outside the heater 1. It is therefore possible to prevent the outside air from being induced to enter the reaction tube 2, which phenomenon would otherwise occur due to, for example, the large difference between the temperature of the interior of the reaction tube 2 and that of the outside air where the wafers 4 are placed.

Then, the reaction tube 2 is raised together with the wafer support 3 which is in close contact with the open end of the reaction tube 2, so that the reaction tube 2 and the wafers 4 which are received at a predetermined position inside the reaction tube 2 are moved to the inside of the heater 1 in a state wherein they are shut off from the outside air, and the wafers 4 are then heated to a predetermined temperature.

Thereafter, a reaction gas mixed with, for example, oxygen gas at a predetermined concentration is supplied to the inside of the reaction tube, 2 from the reaction gas supply tube 2a, whereby a predetermined oxide film is formed on the surface of each of the wafers 4 heated to a predetermined temperature.

Thus, the outside air is prevented from being induced to enter the reaction tube 2 when the wafers 4 are inserted into the reaction tube 2, thereby avoiding various problems, e.g., the surfaces of the wafers 4 being disorderly oxidized by the oxygen contained in the outside air, and the foreign matter such as contaminative particles contained in the outside air being attached to the surfaces of the wafers 4, and thus enabling a predetermined oxide film of excellent quality to be formed on the surface of each wafer 4.

Further, since the reaction tube 2 and the wafer support 3 on which is mounted the cassette 5 having the wafers 4 retained thereon are adapted to be moved vertically in such a manner that they are raised and lowered, there is no fear of any force being applied in a direction perpendicular to the direction of movement of the reaction tube 2 and the wafer support 3 by, for example, their own weights, that is, there is no risk of these members being oscillated horizontally. Therefore, the reaction tube 2 is inserted into the area inside the heater 1 without contacting any portion or member such as the soaking tube 6 provided on the inner peripheral portion of the heater 1.

As a result, it is possible to avoid the problem that the surfaces of the wafers 4 are contaminated by, for example, foreign matter which is separated from the inner surface of the reaction tube 2 due to, e.g., impact generated when the reaction tube 2 is contacted by the soaking tube 6 or other associated members, thereby allowing an oxide film of excellent quality to be formed on the surface of each wafer 4.

After a predetermined period of time has elapsed, the reaction tube 2, together with the wafer support 3, is lowered so that they are positioned outside the heater 1, and the wafers 4 having excellent oxide films formed thereon are then unloaded from the reaction tube 2, together with the cassette 5. [Embodiment 2]

Figure 3:
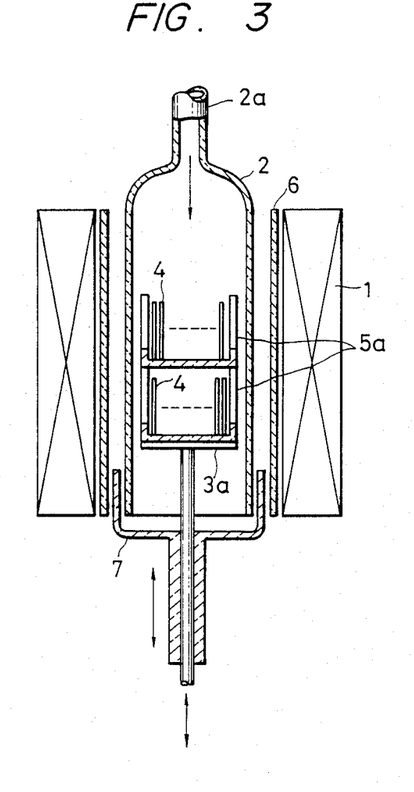
FIG. 3 is a schematic sectional view of a thermal oxide film forming apparatus in accordance with another embodiment of the present invention.

FIG. 3 is a schematic sectional view of a thermal oxide film forming apparatus in accordance with another embodiment of the present invention.

This embodiment differs from the above-described embodiment 1 in that the reaction tube 1 is fixed with respect to the heater 1, and a wafer support 3a (insertion jig) and an auxiliary tube 7 are provided, the wafer support 3a being adapted to be vertically movable while supporting cassettes 5a each accommodating a plurality of wafers 4, and the auxiliary tube 7 being adapted to be vertically movable independently of the wafer support 3a and detachably connected to the open end of the reaction tube 2.

More specifically, the wafers 4 and the cassettes 5a accommodating them are mounted on the wafer support 3a which is integrated with the auxiliary tube 7 below the reaction tube 2, that is, outside the heater 1, and the internal atmosphere of the auxiliary tube 7 is replaced by an inert gas such as nitrogen gas.

The wafer support 3a, on which is mounted the cassettes 5a each accommodating the wafers 4 in such a manner that the plane of each wafer 4 extends vertically, is raised together with the auxiliary tube 7. After the open end portion of the reaction tube 2 has sufficiently been received inside the auxiliary tube 7 to reach a state wherein the outside air is prevented from being induced to enter the reaction tube 2, the wafer support 3a alone is further raised, so that the wafers 4 and the cassettes 5a mounted on the wafer support 3a are positioned in the center of the reaction tube 2 in order to be heated to a predetermined temperature. Then, a reaction gas mixed with, for example, oxygen gas at a predetermined concentration is supplied to the inside of the reaction tube 2 through the reaction gas supply pipe 2a, whereby a predetermined oxide film is formed on the surface of each wafer 4 heated to a predetermined temperature.

Thus, the outside air is prevented from being induced to enter the reaction tube 2 when the wafers 4 are loaded into the reaction tube 2 by virtue of the auxiliary tube 7 which is fitted on the open end portion of the reaction tube 2. It is, therefore, possible to avoid the occurrence of various problems. For example, the surfaces of the wafers 4 are prevented from being disorderly oxidized by the oxygen contained in the outside air, and foreign matter such as contaminative particles contained in the outside air is prevented from being attached to the surfaces of the wafers 4. In consequence, a predetermined oxide film of excellent quality is advantageously formed on the surface of each wafer 4.

Since the wafer support 3a is adapted to be moved vertically, the contact between the wafer support 3a and the inner surface of the reaction tube 2 is prevented, so that it is possible to avoid any foreign matter being generated or separated from the inner surface of the reaction tube 2, and an oxide film of excellent quality is consequently formed on the surface of each wafer 4.

In addition, the wafers 4 are disposed in such a manner that the plane of each wafer 4 extends vertically so as to be parallel to the direction of flow of the reaction gas which is supplied downwardly from the reaction gas supply pipe 2a. Accordingly, the reaction gas is allowed to uniformly contact various portions on the surface of each wafer 4, and this enables an oxide film having a uniform thickness to be formed on the surface of the wafer 4. [Embodiment 3]

Figure 4:
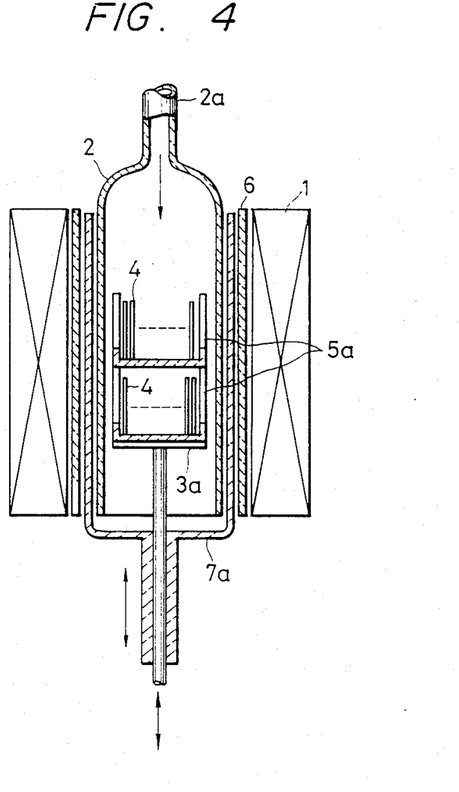
FIG. 4 is a schematic sectional view of a thermal oxide film forming apparatus in accordance with still another embodiment of the present invention.

FIG. 4 is a schematic sectional view of a thermal oxide film forming apparatus in accordance with still another embodiment of the present invention.

This embodiment 3 differs from the above-described embodiment 2 in that the auxiliary tube 7a is extended so as to cover substantially the entire length of the reaction tube 2.

More specifically, prior to the loading of the wafers 4 into the reaction tube 4, the auxiliary tube 7a is fitted on the open end portion of the reaction tube 2, thereby even more reliably preventing the outside air from being induced to enter the reaction tube 2. The operation and advantages of this embodiment are similar to those offered by the embodiment 2. [Embodiment 4]

Figure 5:
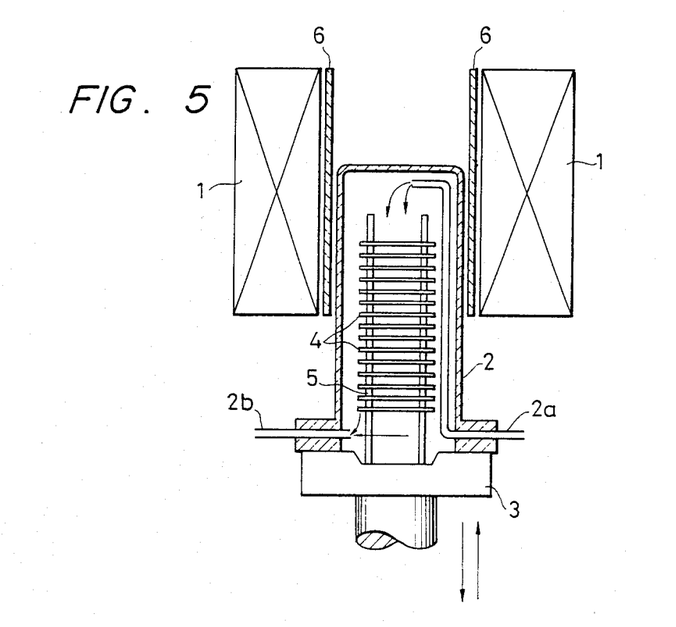
FIGS. 5 and 6 are schematic sectional views of a thermal processing apparatus in accordance with a further embodiment of the present invention, which show the operation of the apparatus sequentially.
Figure 6:
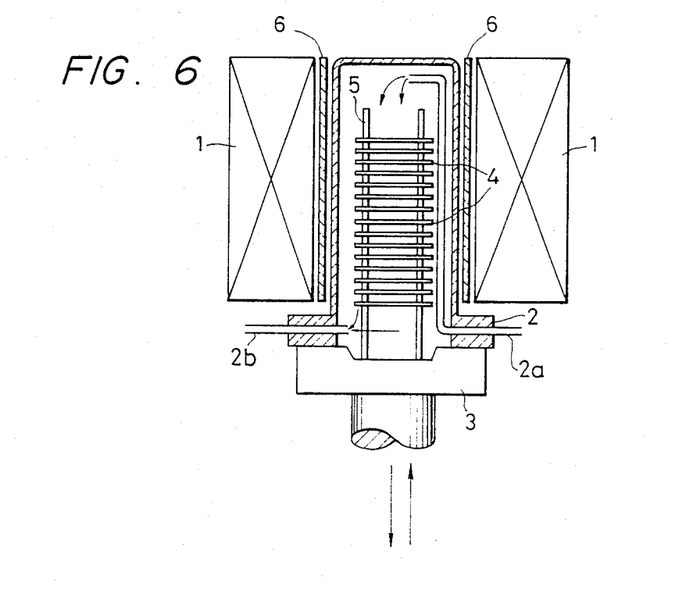

FIGS. 5 and 6 are schematic sectional views of a thermal processing apparatus such as a thermal diffusion apparatus in accordance with a further embodiment of the present invention, which show the operation of the apparatus sequentially.

Referring to FIG. 5, a heater 1 (heating section) is provided in such a manner that the axis thereof extends vertically. A reaction tube 2 (processing chamber) is vertically movably provided inside the heater 1, the reaction tube 2 being adapted such that it is moved in the axial direction of the heater 1 so as to be selectively inserted into the area inside of the heater 1 and drawn out of it.

The reaction tube 2 is made of, e.g., quartz and adapted to be subjected to radiation heat from the heater 1 so that the interior of the tube 1 is heated to a predetermined temperature.

A reaction gas supply pipe 2a is disposed at the lower end of the reaction tube 2 in such a manner that the end portion of the pipe 2a extends through the inside of the reaction tube 2 and opens at the inner upper end of the reaction tube 2 to introduce a reaction gas (processing fluid) to the inside of the reaction tube 2, the reaction gas being mixed with, for example, a diffusion impurity gas at a predetermined ratio. In addition, an exhaust pipe 2b is disposed at the lower end of the reaction tube 2.

A wafer support 3 (insertion jig) is disposed below the reaction tube 2 in such a manner that the wafer support 3 is movable in the direction in which the reaction tube 2 moved up and down. The wafer support 3 is adapted such that a cassette 5 which retains a plurality of wafers 4 (objects to be processed) is detachably mounted on the wafer support 3.

Thus, the reaction tube 2 is lowered from the upper side toward the wafer support 3 which is positioned below the heater 1 and on which the cassette 5 retaining a plurality of wafers 4 is mounted, and wafers 4 which are mounted on the wafer support 3 are inserted into the reaction tube 2 from the opening at the lower end thereof. After the open end of the reaction tube 2 has been brought into close contact with the surface of the wafer support 3, the reaction tub 2 is raised together with the wafer support 3 to reach the position shown in FIG. 6. In consequence, the reaction tube 2 and the plurality of wafers 4 mounted on the wafer support 3 are positioned inside the heater 1 and thereby heated to a predetermined temperature.

In addition, a soaking tube 6 is provided on the inner peripheral portion of the heater 1 in such a manner as to be disposed between the heater 1 and the reaction tube 2 when positioned inside the heater 1, whereby the heat radiated from the heater 1 is uniformly transmitted to the interior of the reaction tube 2.

The operation of this embodiment will be explained below.

First, the heater 1 is allowed to heat up to a predetermined temperature, and the atmosphere inside the reaction tube 2 is replaced by an inert gas such as nitrogen through the reaction gas supply pipe 2a.

Then, the cassette 5 which has a predetermined number of wafers 4 retained thereon is mounted on the wafer support 3 positioned below the heater 1.

Thereafter, the reaction tube 2 is lowered toward the wafer support 3. In consequence, the wafers 4 mounted on the wafer support 3 are moved, outside the heater 1, relative to the reaction tube 2 and thereby inserted to a predetermined position inside the reaction tube 2, and the downward movement of the reaction tube 2 is stopped when the open end of the tube 2 is brought into close contact with the surface of the wafer support 3.

Thus, the operation of inserting the wafers 4 into the reaction tube 2 is conducted outside the heater 1. It is therefore possible to prevent the outside air from being induced to enter the reaction tube 2, which phenomenon would otherwise occur due to, for example, the large difference between the temperature of the interior of the reaction tube 2 and that of the outside air where the wafers 4 are placed.

Then, the reaction tube 2 is raised together with the wafer support 3 which is in close contact with the open end of the reaction tube 2, so that the reaction tube 2 and the wafers 4 which are received at a predetermined position inside the reaction tube 2 are moved to the inside of the heater 1 in a state wherein they are shut off from the outside air, and the wafers 4 are then heated to a predetermined temperature.

Thereafter, a reaction gas mixed with, for example, a diffusion impurity gas at a predetermined concentration is supplied to the inside of the reaction tube 2 from the reaction gas supply tube 2a, whereby a predetermined impurity-diffused layer is formed on the surface of each of the wafers 4 heated to a predetermined temperature.

Thus, the outside air is prevented from being induced to enter the reaction tube 2 when the wafers 4 are inserted into the reaction tube 2, thereby avoiding various problems, e.g., the surfaces of the wafers 4 being disorderly oxidized by the oxygen contained in the outside air, and the foreign matter such as contaminative particles contained in the outside air being attached to the surfaces of the wafers 4, and thus enabling a predetermined diffused layer of excellent quality to be formed on the surface of each wafer 4.

Further, since the reaction tube 2 and the wafer support 3 on which is mounted the cassette 5 having the wafers 4 retained thereon are adapted to be moved vertically in such a manner that they are raised and lowered, there is no fear of any force being applied in a direction perpendicular to the direction of movement of the reaction tube 2 and the wafer support 3 by, for example, their own weights, that is, there is no risk of these members being oscillated horizontally. Therefore, the reaction tube 2 is inserted into the area inside the heater 1 without contacting any portion or member such as the soaking tube 6 provided on the inner peripheral portion of the heated 1.

As a result, it is possible to avoid the problem that the surfaces of the wafers 4 are contaminated by, for example, foreign matter which is separated from the inner surface of the reaction tube 2 due to, e.g., impact generated when the reaction tube 2 is contacted by the soaking tube 6 or other associated members, thereby allowing a diffused layer of excellent quality to be formed on the surface of each wafer 4.

After a predetermined period of time has elapsed, the reaction tube 2, together with the wafer support 3, is lowered so that they are positioned outside the heater 1, and the wafers 4 having excellent diffused layers formed thereon are then unloaded from the reaction tube 2, together with the cassette 5.

In the thermal processing apparatuses in accordance with the embodiments 1 to 3, the supply of a processing fluid is effected through a processing fluid supply pipe connected to the upper end of the reaction tube. Therefore, it is necessary, in order to remove the reaction tube for maintenance, to remove the supply pipe connecting member from the reaction tube main body. In the case of, particularly, a vertical-type reaction tube, the operation of removing the connecting member provided at the upper end of the reaction tube is carried out near the ceiling of a clean room in which the apparatus is placed, which means that it is difficult to conduct such operation and it may be impossible to efficiently maintain the apparatus as a whole. In the case of a reaction tube having a processing fluid exhaust pipe provided at the lower end thereof, it is necessary to remove both the connecting members for the supply and exhaust pipes from the reaction tube main body.

In contrast to the above, the thermal processing apparatus in accordance with this embodiment shown in FIGS. 5 and 6 has processing fluid supply and exhaust pipes both of which are provided at the lower end thereof. Therefore, the upper end of the reaction tube can be closed, and this means that it is possible to remove the reaction tube from the apparatus simply by removing the connecting members provided at the lower end of the reaction tube. Thus, it is possible to increase the operating efficiency at the time of maintenance.

The present invention offers the following various advantages.

A processing chamber and an insertion jig for inserting an object of processing into the chamber are adapted to be individually movable relative to a heating section, and the operation of loading and unloading of the object into and from the processing chamber effected by the insertion jig is conducted outside the heating section. It is therefore possible to prevent the outside air from being induced to enter the processing chamber together with the object of processing, so that the occurrence of various problems is advantageously avoided. For example, the surface of the object of processing is prevented from being undesirably oxidized by the oxygen contained in the outside air, and foreign matter or the like is prevented from being attached to the surface of the object. Thus, excellent processing results can be obtained.

Since the processing chamber and the insertion jig are moved relative to the heating section in the vertical direction, the processing chamber and the insertion jig are prevented from contacting the heating section when they are moved. Thus, it is possible to prevent the surface of the object of processing from being contaminated by foreign matter produced inside the processing chamber due to impact generated when the processing chamber contacts the heating section, so that it is possible to obtain excellent processing results.

The insertion jig, which is adapted to insert an object of processing into the processing chamber through an opening provided in the chamber, is provided with an auxiliary tube which is movable relative to the direction of movement of the insertion jig and which is detachably connected to the opening of the processing chamber. It is therefore possible to prevent the outside air from being induced to enter the reaction tube together with the object of processing when inserted into the heated processing chamber. Thus, it is possible to avoid the occurrence of various problems. For example, the surface of the object of processing is prevented from being undesirably oxidized by the oxygen contained in the outside air, and foreign matter or the like is prevented from being attached to the surface of the object. Accordingly, excellent processing results can be obtained.

Since the insertion jig is moved vertically, the jig is prevented from contacting the interior of the processing chamber when the jig inserts the object of processing into the chamber. Thus, it is possible to avoid the generation of foreign matter due to the contact of the insertion jig with the interior of the processing chamber, so that excellent processing results can be obtained.

Since the auxiliary tube is extended in the axial direction of the processing chamber, the outside air is even more reliably prevented from being induced to enter the processing chamber, thereby allowing excellent processing results to be obtained.

The object of processing is disposed in such a manner that the place thereof extends parallel to the direction of flow of the processing fluid which is supplied into the processing chamber. In consequence, the processing fluid is allowed to uniformly contact the surface of the object. Thus, the reaction for forming, for example, an oxide file uniformly takes place over the surface of the object of processing, so that it is possible to form an oxide file having a uniform thickness.

Since the processing fluid supplied into the reaction tube from the lower end thereof can be discharged from the lower end, it is possible to close the upper end of the reaction tube, which enables the reaction tube to be readily removed simply by removing the connecting chamber at the lower end of the reaction tube. Accordingly, it is possible to increase the operating efficiency at the time of maintenance of the apparatus.

Although the invention accomplished by the present inventors has been described in detail by way of the embodiments, it is a matter of course that the present invention is not necessarily limited to the above-described embodiments, and various changes and modifications may be imparted thereto without departing from the scope of the invention.

For example, the apparatus may be disposed in such a manner that the axis thereof extends horizontally. In addition, the heating means may employ infrared or high-frequency heating.

The invention accomplished by the present inventors has been described above by way of embodiments in which the present invention is applied to the thermal oxide film forming technique and the thermal diffusion film forming technique employed in the field of manufacturing semiconductor devices which is the technical background of the present invention. However, the present invention is not necessarily limited to the above-described techniques, and the invention is further applicable to thermal processing apparatuses such as a CVD (Chemical Vapor Deposition) apparatus and an annealing apparatus. In addition, the present invention is widely applicable to processing techniques in which the intrusion of the outside air into the processing chamber is undesirable.

What is claimed is:

1. A method for treating semiconductor wafers using a vertical thermal treatment furnace, the thermal treatment furnace including cylindrical heating means having a cylindrical cavity therethrough lengthwise in which the semiconductor wafers are situated during a thermal treatment in the vertical thermal treatment furnace, the cavity having an axis which extends substantially in the vertical direction, the cavity having an opening, for loading and unloading wafers, disposed at one end thereof, the furnace also including a wafer holder for loading and unloading the wafers into and out of the cavity, the wafers being supported by the wafer holder and disposed along the axis of the cavity, the method comprising steps of:
    (a) arranging the wafers, that are supported by the wafer holder, into a cylindrical process tube, the process tube having a diameter smaller than the cavity, the arranging the wafers in the process tube being performed with the process tube substantially outside the cavity;
    (b) moving the wafers relative to the cavity, supported by the wafer holder, so as to position the wafers in the cavity, the wafers being moved into the cavity through the opening, both the process tube and wafers being moved to position the wafers in the cavity;
    (c) heat-treating the wafers in the cavity at a predetermined temperature; and
    (d) unloading the wafers in the cavity out of the cavity, through said opening.

2. A method according to claim 1, wherein the wafers are moved into the cavity such that the wafers are disposed at a substantially central location of said cavity.

3. A method according to claim 1, wherein the heating means is disposed adjacent the cavity, and wherein the moving the wafers so as to position the wafers in the cavity moves the wafers from a location away from the heating means to a location in the cavity adjacent the heating means.

4. A method according to claim 2, wherein said axis is the axis of the cylinder.

5. A method according to claim 4, wherein the semiconductor wafers are adapted for providing semiconductor integrated circuits, the method being a method for fabricating semiconductor integrated circuit devices.

6. A method according to claim 5, wherein the step of arranging the wafers is performed apart from the heating means.

7. A method according to claim 1, wherein the step of moving the wafers into the cavity includes moving the process tube into the cavity.

8. A method according to claim 7, wherein the step of moving the wafers moves the wafers into the cavity while the wafers are in the process tube, the wafers and process tube being moved together to position both the wafers and process tube in the cavity, the wafers being positioned adjacent the heating means.

9. A method according to claim 1, wherein the step of moving the wafers moves the wafers into the cavity while the wafers are in the process tube, the wafers and process tube being moved to position both the wafers and process tube in the cavity, the wafers being positioned adjacent the heating means.

10. A method according to claim 9, further comprising the step of providing the process tube with an inert gas during loading the wafers to prevent the outside air from being induced to enter the process tube in vicinity of the wafers.

11. A method according to claim 10, wherein the process tube extends lengthwise over the wafers so as to be able to prevent the outside air from being induced to enter the process tube to a location adjacent the wafers.

12. A fabrication method according to claim 11, further comprising the step of providing the process tube with a reaction gas during the heat treatment.

13. A method according to claim 12, wherein the heat treatment is an oxide film formation on the wafers.

14. A method according to claim 13, wherein the oxide film formation is performed by oxidizing the major surfaces of the wafers.

15. A method according to claim 1, wherein the wafers, supported by the wafer holder, are arranged into the process tube by (1) heating the process tube within the cavity; (2) moving the process tube to a position substantially outside the cavity; and thereafter (3) moving the wafers, supported by the wafer holder, into the process tube.

16. A method for fabricating semiconductor integrated circuits utilizing semiconductor wafers, the wafers being treated using a vertical thermal treatment furnace having cylindrical heating means having a cylindrical cavity therethrough lengthwise maintained at a relatively high temperature, as compared to the temperature outside the cavity, the axis of said cylindrical cavity being substantially vertical, the cylindrical cavity having an opening at one end thereof for loading and unloading the semiconductor wafers, the furnace further including a wafer holder for supporting the wafers, the wafers being supported such that the wafers are arranged along the axis of the cylindrical cavity, the furnace further including loading means for loading and unloading wafers supported by the wafer holder into and out of the cylindrical cavity, the method comprising the steps of:

(a) associating the wafers with the wafer holder, said associating being performed outside the cavity, the wafers extending over a length;

(b) accommodating the wafers, associated with the wafer holder, in a process tube having a diameter smaller than that of the cylindrical cavity, the process tube having a length longer than the length that the wafers extend such that outside air is prevented from being introduced into the process tube to the wafers associated with the wafer holder;

(c) loading the wafers, that are associated with the wafer holder and inside the process tube, into the cavity using the loading means, the wafers being loaded into the cavity to a substantially central position therein, the process tube being provided with an inert gas during said loading so as to prevent air outside the process tube from entering the process tube and reaching the wafers on the wafer holder, the wafers associated with the wafer holder and in the process tube being loaded into the cavity by moving, relative to the cavity, both the wafers associated with the wafer holder and the process tube so that the wafers are always positioned in the process tube during said loading;

(d) heat-treating the wafers associated with the holder at a predetermined temperature, while the wafers in the process tube are located at the substantially central position in the cavity, the process tube being provided with a reaction gas during the heat treatment; and then (e) unloading the wafers associated with the wafer holder out of the cavity through the opening, using the loading means.

17. A method according to claim 16, wherein during said loading the wafers are always in the process tube.

18. A process according to claim 16, wherein the wafers on the wafer holder are moved by moving the wafer holder, whereby both the wafer holder and the process tube are moved in loading the wafers into the cavity.

19. A method according to claim 16, wherein the inert gas is provided from one end of the process tube.

20. A method according to claim 19, wherein the reaction gas is provided from said one end of the process tube.

21. A method according to claim 16, wherein the process tube is open-ended at a second end thereof, other than a first end.

22. A method according to claim 21, wherein the inert gas is provided from said second end of the process tube.

23. A method according to claim 22, wherein the reaction gas is provided from said second end of the process tube.

24. A method according to claim 23, wherein the heat treatment is an oxide film formation on the wafers.

25. A method according to claim 24, wherein the oxide film formation is performed by oxidizing the major surfaces of the wafers.

26. A method according to claim 20, wherein the heat treatment is an oxide film formation on the wafers by oxidizing the surfaces of the wafers.

27. A method according to claim 16, wherein the wafers, associated with the wafer holder, are accommodated in the process tube by (1) heating the process tube within the cavity; (2) moving the process tube to a position substantially outside the cavity; and thereafter (3) moving the wafers, associated with the wafer holder, into the process tube.

28. A method according to claim 16, wherein, during the step of loading the wafers into the cavity, the process tube moves into the cavity.

29. A method for fabricating semiconductor integrated circuits utilizing semiconductor wafers, the wafers being treated using a vertical thermal treatment furnace including a vertical tubular heating means having a vertical cylindrical cavity therethrough lengthwise maintained at a relatively high temperature as compared to the temperature outside the cavity, the cavity having an opening at one end thereof for loading and unloading the semiconductor wafers, the furnace further including a wafer holder for supporting the wafers, the wafers being supported such that the wafers are arranged along a rotational symmetric axis of the cavity, the furnace further including loading means for loading and unloading wafers supported by the wafer holder into and out of the cavity, the method comprising the steps of:

(a) associating the wafers with the wafer holder, said associating being performed outside the cavity, the wafers extending over a length of the holder in the direction of the symmetric axis of the cavity;

(b) accommodating the wafers, associated with the holder, inside a round tubular process tube along a rotational symmetric axis thereof, the process tube having an outer diameter smaller then that of the cavity, the process tube extending over the entire length of the wafers associated with the holder;

(c) loading the wafers, associated with the holder and inside the process tube, into the cavity using the loading means so that both the wafers and the holder do not contact the inner surface of the process tube, the wafers being loaded into the cavity to a substantially central position therein, a purge gas for purging outside air being provided into the process tube during said loading, both the process tube and wafers being moved relative to the cavity to position the wafers at the substantially central position in the cavity;

(d) heat-treating the wafers, associated with the holder, at a predetermined temperature, while the wafers in the process tube are located at the substantially central position in the cavity, the process tube being provided with a reaction gas during the heat treatment; and then (e) unloading the wafers associated with the wafer holder out of the cavity through the opening using the loading means.

30. A method according to claim 29, wherein, during the step of loading the wafers into the cavity, the process tube moves into the cavity.

31. A method according to claim 30, wherein the wafers are unloaded by unloading the wafers, associated with the holder and inside the process tube, out of the cavity using the loading means so that both the wafers and the holder do not contact the inner surface of the process tube, while a purge gas for purging outside air and a reaction gas is provided in the process tube during said unloading, and by moving, relative to the cavity, the process tube and the wafers to position the wafers outside the cavity.

32. A method according to claim 31, wherein said process tube has upper and lower ends.

33. A method according to claim 32, wherein the reaction gas is provided through the lower end, or the vicinity of thereof, into the process tube.

34. A method according to claim 33, wherein the process tube is closed at the upper end.

35. A method according to claim 34, wherein the purge gas is provided through the lower end, or the vicinity thereof, into the process tube.

36. A method according to claim 35, wherein the reaction gas and the purge gas are provided through at least one gas supply pipe entering the process tube through the lower end of the process tube or in the vicinity thereof, and at least one outlet of the gas supply is disposed at the upper end and inside of the process tube.

37. A method according to claim 36, wherein a main component of the purge gas is an inert gas.

38. A method according to claim 37, wherein the inert gas is nitrogen.

39. A method according to claim 36, wherein the heat treatment is an oxide film formation on the wafers.

40. A method according to claim 39, wherein the oxide film formation is performed by oxidizing major surfaces of the wafers.

41. A method for fabricating semiconductor devices utilizing semiconductor wafers, the wafers being treated using a vertical thermal treatment furnace including a vertical tubular heating means having a vertical cylindrical cavity therethrough lengthwise maintained at a relatively high temperature as compared to the temperature outside the cavity, the cavity having an opening at one end thereof for loading and unloading the semiconductor wafers, the furnace further including a wafer holder associated with the wafers, for supporting the wafers, the wafers being supported such that the wafers are arranged along a rotational symmetric axis of the cavity, the furnace further including loading means for loading and unloading wafers supported by the wafer holder into and out of the cavity, the method comprising the steps of:
(a) arranging the wafers associated with the wafer holder, said arranging being performed outside the cavity, the wafers extending over a length of the holder in the direction of the symmetry axis of the cavity;
(b) accommodating the wafers, associated with the holder, inside a round tubular process tube along a rotational symmetric axis thereof, the process tube having an outer diameter smaller than that of the cavity, the process tube extending over the entire extending length of the wafers associated with the holder;
(c) loading the wafers, associated with the holder and inside the process tube, into the cavity using the loading means, the wafers being loaded into the cavity to a substantially central position therein, a purge gas for purging outside air being provided into the process tube during said loading, both the process tube and wafers being moved relative to the cavity to position the wafers at the substantially central position in the cavity;
(d) heat-treating the wafers associated with the holder at a predetermined temperature, while the wafers in the process tube are located at the substantially central position in the cavity, the process tube being provided with a reaction gas during the heat treatment; and then
(e) unloading the wafers associated with the wafer holder out of the cavity through the opening, using the loading means.

42. A method according to claim 41, wherein, during the step of loading the wafers into the cavity, the process tube is moved into the cavity.

43. A method according to claim 42, wherein the wafers are unloaded by unloading the wafers, associated with the holder and inside the process tube, out of the cavity using the loading means, while a purge gas for purging outside air and a reaction gas is provided into the process tube during said unloading, and by moving, relative to the cavity, the process tube and the wafers to position the wafers outside the cavity.

44. A method according to claim 43, wherein the process tube has upper and lower ends.

45. A method according to claim 44, wherein the reaction gas is provided through the lower end, or the vicinity thereof, of the process tube.

46. A method according to claim 45, wherein the process tube is closed at the upper end.

47. A method according to claim 46, wherein the purge gas is provided through the lower end, or the vicinity thereof, of the process tube.

48. A method according to claim 47, wherein the reaction gas and the purge gas are provided through at least one gas supply pipe entering the process tube through the lower end, or the vicinity thereof, and at least one outlet of the pipe is disposed at the upper end and inside of the process tube.

49. A method according to claim 48, wherein a main component of the purge gas is an inert gas.

50. A method according to claim 49, wherein the inert gas is nitrogen.

51. A method according to claim 50, wherein the heat treatment is an oxide film formation on the wafers.

52. A method according to claim 50, wherein the oxide film formation is performed by oxidizing major surfaces of the wafers.

53. A method for fabricating semiconductor devices utilizing semiconductor wafers, the wafers being treated using a vertical thermal treatment furnace including a vertical tubular heating means having a vertical cavity therethrough lengthwise maintained at a relatively high temperature as compared to the temperature outside the cavity, the cavity having an opening at one end thereof for loading and unloading the semiconductor wafers, the furnace further including a wafer holder, associated with the wafers, for supporting the wafers, the wafers being supported such that the wafers are arranged along a vertical axis of the cavity, the furnace further including loading means for loading and unloading wafers supported by the wafer holder into and out of the cavity, the method comprising the steps of:
- (a) arranging the wafers so as to be associated with the wafer holder, said arranging being performed outside the cavity, the wafers extending over a length of the holder in the direction of the vertical axis of the cavity;
- (b) accommodating the wafers, associated with the holder, inside a round tubular process tube along a vertical axis thereof, the process tube having an outer diameter smaller than that of the cavity, the process tube extending over the entire extending length of the wafers associated with the holder;
- (c) loading the wafers, associated with the holder and inside the process tube, into the cavity using the loading means, the wafers being loaded into the cavity to a substantially central position therein, a gas for purging outside air being provided into the process tube during said loading, both the process tube and wafers being moved relative to the cavity to position the wafers at the substantially central position in the cavity;
- (d) heat-treating the wafers associated with the holder at a predetermined temperature, while the wafers in the process tube are located at the substantially central position in the cavity, the process tube being provided with a reaction gas during the heat treatment; and then
- (e) unloading the wafers associated with the wafer holder out of the cavity through the opening, using the loading means.

54. A method according to claim 53, wherein, during the step of loading the wafers into the cavity, the process tube is moved into the cavity.

55. A method according to claim 54, wherein the wafers are unloaded by unloading the wafers, associated with the holder and inside the process tube, out of the cavity using the loading means, while a gas for purging outside air is provided into the process tube during said unloading, and by moving, relative to the cavity, the process tube and the wafers to position the wafers outside the cavity.

56. A method according to claim 55, wherein the process tube has upper and lower ends.

57. A method according to claim 56, wherein the reaction gas is provided through the lower end of the process tube, or the vicinity thereof.

58. A method according to claim 57, wherein the process tube is closed at the upper end.

59. A method according to claim 58, wherein the gas for purging is provided through the lower end, or the vicinity thereof, of the process tube.

60. A method according to claim 59, wherein the reaction gas and the gas for purging are provided through at least one gas supply pipes entering the process tube through the lower end or the vicinity thereof, and at least one outlet of the pipe is disposed at the upper end and inside of the process tube.

61. A method according to claim 60, wherein a component of the gas for purging is an inert gas.

62. A method according to claim 61, wherein the inert gas is nitrogen.

63. A method according to claim 62, wherein the heat treatment is an oxide film formation on the wafers.

64. A method according to claim 63, wherein the oxide film formation is performed by oxidizing major surfaces of the wafers.

* * * * *